United States Patent
Dohata (10) Patent No.: US 7,202,017 B2
(45) Date of Patent: Apr. 10, 2007

(54) SUBSTRATE, METHOD OF MANUFACTURING MULTI-LAYER SUBSTRATE, AND SATELLITE BROADCASTING RECEPTION APPARATUS

(75) Inventor: Hiroyuki Dohata, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 83 days.

(21) Appl. No.: 10/896,176

(22) Filed: Jul. 22, 2004

(65) Prior Publication Data

US 2005/0064342 A1 Mar. 24, 2005

(30) Foreign Application Priority Data

Aug. 25, 2003 (JP) ............................. 2003-300116

(51) Int. Cl.
*G03C 5/00* (2006.01)
(52) U.S. Cl. ................................. 430/311; 343/700 MS
(58) Field of Classification Search ......... 343/700 MS, 343/713, 702; 430/311; 333/26, 33, 247
See application file for complete search history.

(56) References Cited

U.S. PATENT DOCUMENTS

| | | | | |
|---|---|---|---|---|
| 5,278,685 A | | 1/1994 | Iwamoto et al. | ............... 359/82 |
| 5,668,563 A | * | 9/1997 | Ogino et al. | ................ 343/713 |
| 6,816,028 B2 | * | 11/2004 | Kato | ........................... 333/26 |
| 7,046,197 B2 | * | 5/2006 | Okado | ................ 343/700 MS |

FOREIGN PATENT DOCUMENTS

| | | |
|---|---|---|
| JP | 4-15864 U | 2/1992 |
| JP | 2003-204127 | 7/2003 |

* cited by examiner

*Primary Examiner*—Tuyet Vo
*Assistant Examiner*—Jimmy Vu
(74) *Attorney, Agent, or Firm*—Birch, Stewart, Kolasch & Birch, LLP (57) ABSTRACT

A substrate includes a main substrate having a pattern as a first pattern layer on a main surface, a sub substrate having a dummy pattern as a second pattern layer on a main surface, a bridge (connection portion) connecting the main substrate and the sub substrate, and a thin portion provided on the bridge between the patterns. A multi-layer substrate is fabricated by laminating the main substrates separated from the sub substrate, and an LNB includes the multi-layer substrate.

7 Claims, 8 Drawing Sheets

SUBSTRATE, METHOD OF MANUFACTURING MULTI-LAYER SUBSTRATE, AND SATELLITE BROADCASTING RECEPTION APPARATUS

This nonprovisional application is based on Japanese Patent Application No. 2003-300116 filed with the Japan Patent Office on Aug. 25, 2003 the entire contents of which are hereby incorporated by reference.

BACKGROUND OF THE INVENTION

1. Field of the Invention

The present invention relates to a substrate, a method of manufacturing a multi-layer substrate, and a satellite broadcasting reception apparatus. More specifically, the present invention relates to a substrate having a pattern layer on a main surface, a multi-layer substrate manufactured with the substrate, and a satellite broadcasting reception apparatus including the multi-layer substrate.

2. Description of the Background Art

As a substrate having a pattern layer on a main surface, a substrate having a pattern formed from copper on a fluoroplastic substrate has conventionally be used, for example.

In the field of a satellite broadcasting reception apparatus (hereinafter, referred to as "Low Noise Block down converter" or "LNB"), for example, as the number of channels for satellite broadcasting and satellite communication is increased and reception from a plurality of satellites prevails, a reception system in which reception has been carried out by a plurality of LNBs tends to be replaced with a system in which reception is carried out by a single LNB. Consequently, the LNB tends to be equipped with a multi-layer substrate.

In manufacturing such an LNB, the substrate sometimes has a special shape such as a trapezoid, from the viewpoint of a smaller size or reduction in weight. For example, in some cases, in forming a pattern such as an interconnection on the main surface in an intermediate step of manufacturing the substrate, a sub substrate connected to a main substrate and serving as registration unit is provided, so that the entire main substrate and sub substrate has a simple shape such as a rectangle.

Figure 13:
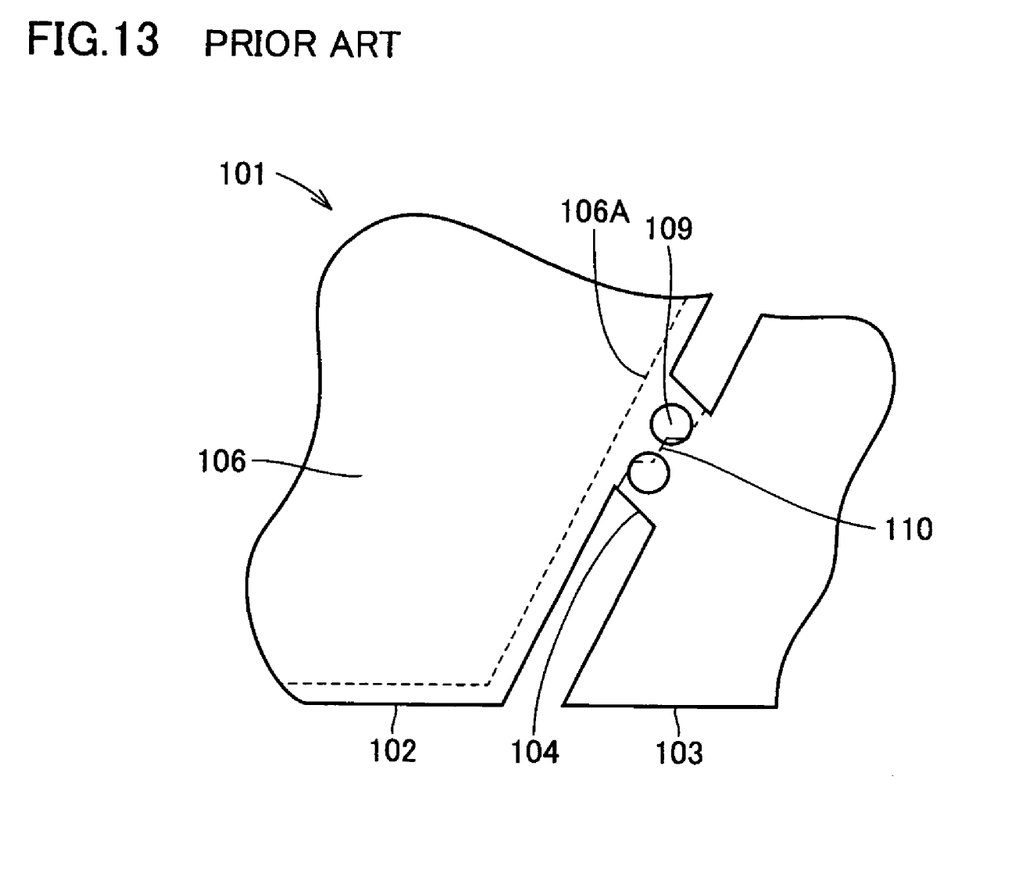
FIG. 13 is a detail view showing an area around a connection portion between a main substrate and a sub substrate in a conventional substrate.

FIG. 13 is an enlarged view showing one example of a structure around a connection portion connecting the main substrate and the sub substrate described above in a conventional substrate.

Referring to FIG. 13, in a substrate 101, a main substrate 102 is connected to a sub substrate 103 by a connection portion 104. A pattern 106 is formed on main substrate 102 in an area surrounded by a pattern outline 106A. Connection portion 104 is provided with an NC hole 109 of which opening position is controlled by numerical control (NC), in order to guide a separation line between main substrate 102 and sub substrate 103.

With the structure described above, registration of the substrate can be facilitated in forming the pattern described above, and the main substrate can be separated from the sub substrate after the pattern is formed.

On the other hand, the substrate as described above has suffered from the following problems.

From the viewpoint of simplification of the steps and reduction in manufacturing cost, the step of separating the main substrate from the sub substrate described above may be performed with a method not requiring a new apparatus dedicated for that step, for example, manually.

In such a case, however, a separation line 110 may be formed at an unintended position or in an unintended shape such as a stepped shape as shown in FIG. 13, for example.

Japanese Utility Model Laying-Open No. 4-15864 (conventional example 1) discloses a printed board characterized in that conductive patterns are provided on a substrate to be removed (sub substrate) and connected integrally with a metal on a wall surface in perforations.

The conductive patterns in conventional example 1, however, are provided in order to remove plating formed on the wall surface in the perforations in forming through hole plating. That is, conventional example 1 does not disclose a concept to stabilize a position of a separation line between the pattern on the main substrate and the pattern on the sub substrate.

SUMMARY OF THE INVENTION

The present invention was made in view of the above-described problems. A feature of the present invention is to provide a substrate attaining a stable position of a separation line between a main substrate and a sub substrate, a method of manufacturing a multi-layer substrate obtained by laminating the substrates, and a satellite broadcasting reception apparatus (LNB) including the multi-layer substrate.

In one aspect, a substrate according to the present invention includes: a main substrate having a first pattern layer on a main surface; a sub substrate having a second pattern layer on a main surface; a connection portion connecting the main substrate and the sub substrate; and a thin portion provided on the connection portion between the first and second patterns.

Accordingly, as the main substrate can be separated from the sub substrate along the thin portion, the separation line will not be located at an unintended position or will not be in an unintended shape. As a result, reliability of the pattern formed on the main substrate is improved.

A through hole may be provided in the main substrate in the vicinity of the connection portion.

Accordingly, a through hole area is formed in the main substrate in the vicinity of the separation line between the main substrate and the sub substrate. As the pattern is not formed in that area, consequently, the pattern in the vicinity of the separation line will not come off.

A concave portion may be provided in an outline of the first pattern area in the vicinity of the connection portion.

Accordingly, a patternless area is formed on the main substrate in the vicinity of the separation line between the main substrate and the sub substrate. As a result, the pattern in the vicinity of the separation line will not come off.

An opening may be provided in the connection portion between the first and second patterns.

As the separation line is guided by the opening, the separation line can be brought to an intended position with higher accuracy.

In another aspect, a substrate according to the present invention includes: a main substrate having a first pattern layer on a main surface; a sub substrate having a second pattern layer on a main surface; and a connection portion between the main substrate and the sub substrate. At least one of the first and second pattern layers has a protruding portion protruding on the connection portion.

As the protruding portion guides the separation line between the main substrate and the sub substrate, the separation line will not be located at an unintended position or will not be in an unintended shape.

A method of manufacturing a multi-layer substrate according to the present invention includes the steps of: fabricating a plurality of substrates in which a main substrate and a sub substrate are connected by a connection portion; forming a first pattern layer on the main substrate, forming a second pattern layer on the sub substrate, and forming a protruding portion protruding on the connection portion on at least one of the first and second pattern layers; separating the main substrate from the sub substrate at the connection portion located in the vicinity of the protruding portion; and laminating the main substrates.

Accordingly, a multi-layer substrate in which the separation line position is stable and the pattern formed on the main substrate attains high reliability can be obtained.

A satellite broadcasting reception apparatus according to the present invention includes the multi-layer substrate manufactured with the method described above.

As described above, the pattern attaining high reliability is formed in the multi-layer substrate. Consequently, the satellite broadcasting reception apparatus attaining high reliability can be provided.

The foregoing and other features, aspects and advantages of the present invention will become more apparent from the following detailed description of the present invention when taken in conjunction with the accompanying drawings.

DETAILED DESCRIPTION

In the following, embodiments of a substrate attaining a stable position of a separation line between a main substrate and a sub substrate, a method of manufacturing a multi-layer substrate obtained by laminating the substrates, and an LNB including the multi-layer substrate according to the present invention will be described with reference to FIGS. 1 through 12.

Figure 1:
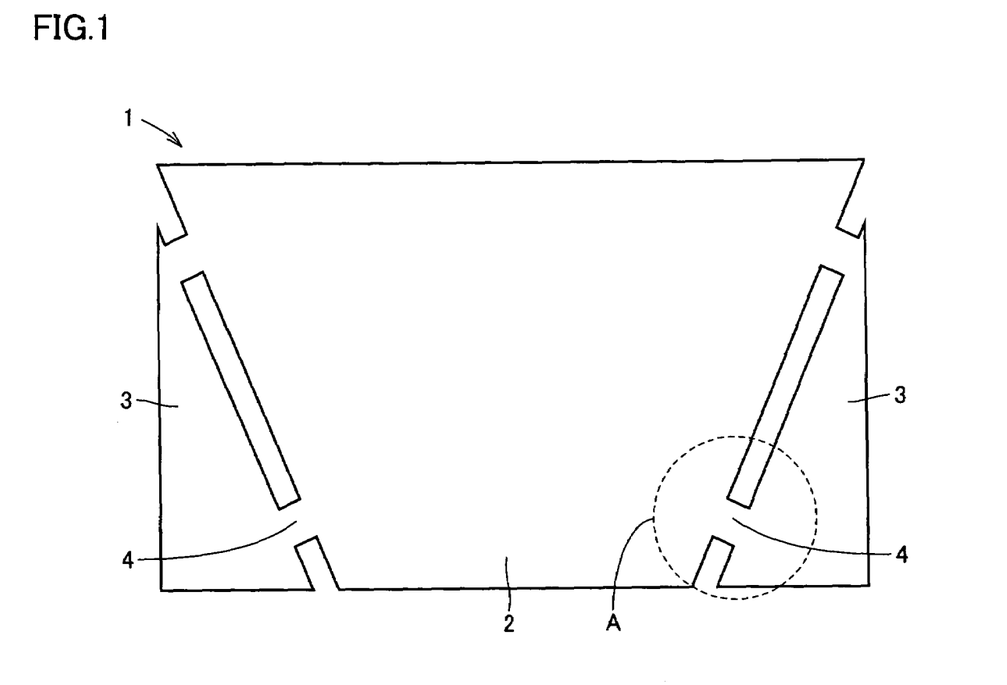
FIG. 1 is a top view of a substrate according to Embodiments 1 to 6 of the present invention.

FIG. 1 is a top view of a substrate 1 according to Embodiments 1 to 6 of the present invention.

Substrate 1 includes a main substrate 2, a sub substrate 3, and a bridge 4 serving as a connection portion between main substrate 2 and sub substrate 3.

(Embodiment 1)

Figure 2:
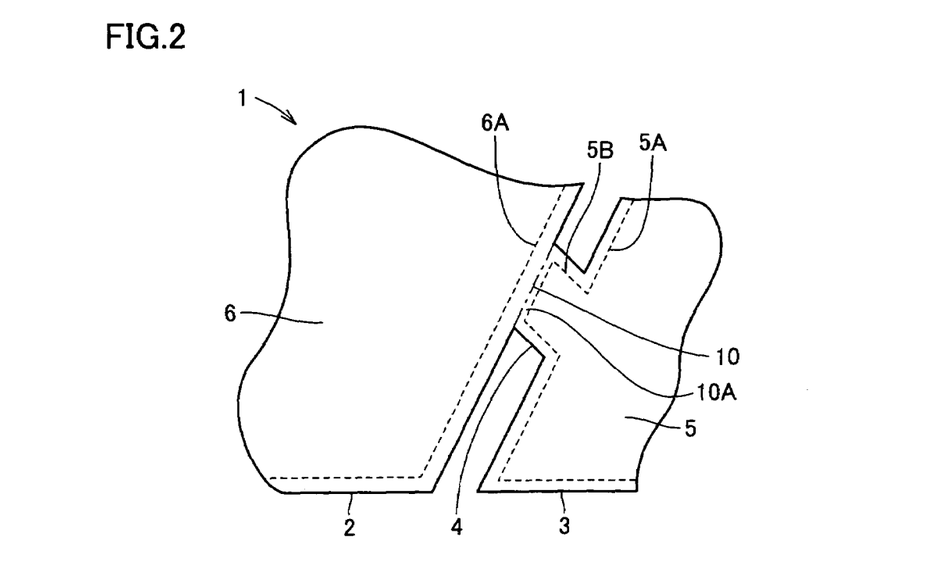
FIG. 2 is a detail view of a portion A in FIG. 1, in the substrate according to Embodiment 1 of the present invention.

FIG. 2 is an enlarged, detail view of an area around portion A (see FIG. 1) in substrate 1 according to Embodiment 1.

Substrate 1 according to the present embodiment includes main substrate 2 having a pattern 6 as a first pattern layer on a main surface, sub substrate 3 having a dummy pattern 5 as a second pattern layer on a main surface, bridge 4 (connection portion) connecting main substrate 2 and sub substrate 3, and a thin portion 10A provided on bridge 4 between patterns 5, 6, as shown in FIG. 2.

Here, patterns 5, 6 are formed in areas surrounded by pattern outlines 5A, 6A respectively. Thin portion 10A refers to a portion that lies between portions where patterns 5, 6 are formed (thick portion) and exposes main substrate 2, with a thickness relatively smaller than that of the thick portion.

Substrate 2 is not reinforced by patterns 5, 6 in thin portion 10A. Therefore, when a force for separating substrate 2 from substrate 3 is applied, a separation line 10 tends to be formed along portion 10A. In other words, separation line 10 is guided along thin portion 10A.

Meanwhile, in a conventional substrate, the separation line sometimes has been formed at an unintended position and in an unintended shape when the main substrate is separated from the sub substrate, resulting in damage of the pattern formed on the main substrate. On the other hand, providing a facility dedicated for separation for the purpose of avoiding damage of the pattern is an obstacle in reducing manufacturing cost.

In the substrate according to the present embodiment (substrate 1), main substrate 2 can be separated from sub substrate 3 along separation line 10 guided along thin portion 10A. Accordingly, the position and the shape of separation line 10 can be adjusted by adjusting the positions and the shapes of pattern outlines 5A, 6A, whereby the separation line will not be located at an unintended position or will not be in an unintended shape. Consequently, damage of the pattern in separating substrate 2 from substrate 3 can be avoided, and reliability of pattern 6 formed on main substrate 2 is improved. In FIG. 1, thin portion 10A is formed like a belt (linearly) along the outline of main substrate 2. Therefore, main substrate 2 separated from sub substrate 3 has the outline without noticeable convex and concave portions.

In the structure describe above, the step of separation can be performed manually, for example. That is, the step of separation can be performed without providing a new apparatus therefor. Accordingly, reduction in the cost in manufacturing the substrate can also be achieved.

Substrate 1 is formed with a dielectric such as fluoroplastic. In addition, pattern 6 is formed with a conductor such as copper. Dummy pattern 5 may be formed with a material the same as that for pattern 6 from the viewpoint of cost reduction, and film forming and patterning is performed in the steps the same as those for pattern 6. However, any conductor or dielectric made of a material different from that for pattern 6 may be used for forming dummy pattern 5, so long as a stable separation line position described above is effectively ensured.

Thickness or size of substrate 1 and patterns 5, 6 should be selected depending on a material for the substrate and the pattern, application of the substrate, or the like. For example, the substrate and the pattern may have a thickness of approximately 0.5 mm respectively.

In other words, substrate 1 according to the present embodiment includes main substrate 2 having a layer of pattern 6 on the main surface, sub substrate 3 having a layer of dummy pattern 5 on the main surface, and bridge 4 (connection portion) between substrates 2, 3. Dummy pattern 5 includes a protruding portion 5B protruding on bridge 4. The protruding portion may be provided on pattern 6 side, or may be provided on both patterns 5, 6.

With the structure described above, in separating main substrate 2 from sub substrate 3, separation line 10 between substrates 2, 3 is guided between patterns 5, 6. Therefore, separation line 10 will not be located at an unintended position or will not be in an unintended shape.

(Embodiment 2)

Figure 3:
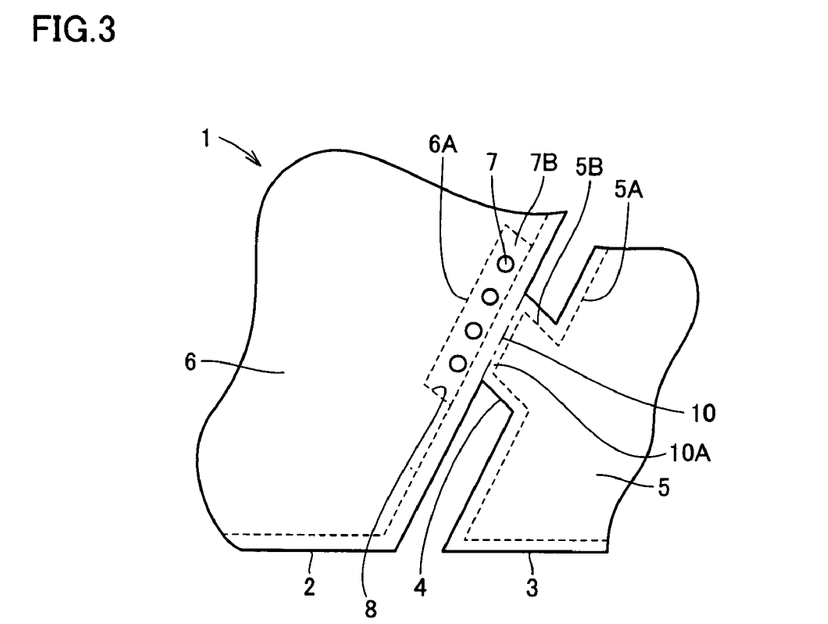
FIG. 3 is a detail view of portion A in FIG. 1, in the substrate according to Embodiment 2 of the present invention.

FIG. 3 is an enlarged, detail view of an area around portion A (see FIG. 1) in substrate 1 according to Embodiment 2.

In substrate 1 according to the present embodiment, a through hole 7 is provided in main substrate 2 in the vicinity of bridge 4 (connection portion), as shown in FIG. 3.

Accordingly, a through hole area 7B is formed in main substrate 2 in the vicinity of separation line 10 between main substrate 2 and sub substrate 3. Since pattern 6 is not formed in area 7B, a concave portion 8 is formed in pattern outline 6A. As a result, in separating main substrate 2 from sub substrate 3, pattern 6 in the vicinity of separation line 10 will not come off.

It is noted that detailed description of components in the present embodiment similar to those in Embodiment 1 will not be repeated.

(Embodiment 3)

Figure 4:
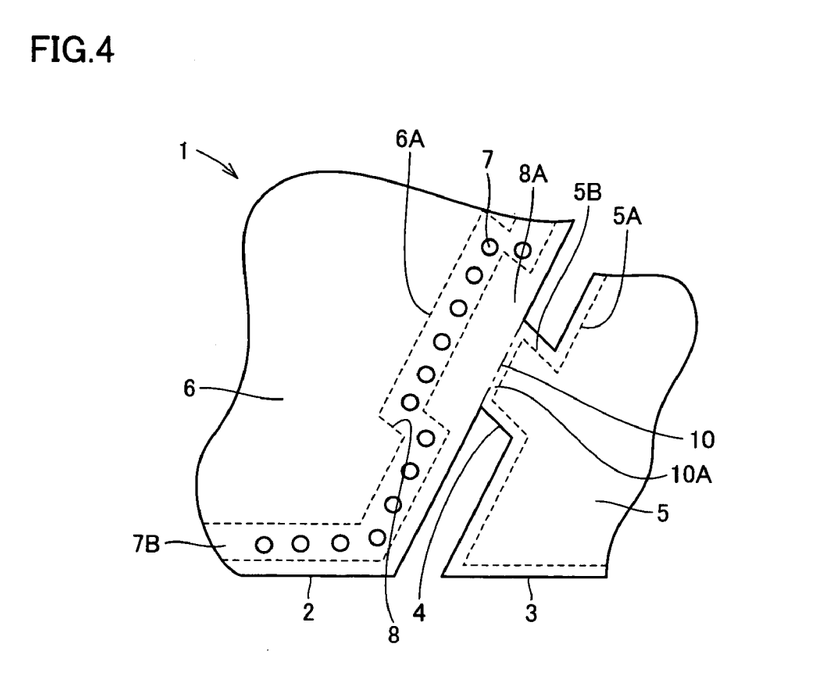
FIG. 4 is a detail view of portion A in FIG. 1, in the substrate according to Embodiment 3 of the present invention.

FIG. 4 is an enlarged, detail view of an area around portion A (see FIG. 1) in substrate 1 according to Embodiment 3.

In substrate 1 according to the present embodiment, through hole 7 is provided along pattern outline 6A, and formed such that pattern outline 6A is located away from bridge 4 (connection portion) in the vicinity of the connection portion, as shown in FIG. 4.

Accordingly, through hole area 7B and a patternless area 8A are formed in main substrate 2 in the vicinity of separation line 10 between main substrate 2 and sub substrate 3. Since pattern 6 is not formed in areas 7B, 8A, concave portion 8 larger than in Embodiment 2 can be formed in pattern outline 6A. As a result, an effect to avoid coming-off of pattern 6 in the vicinity of separation line 10 can be enhanced in separating main substrate 2 from sub substrate 3.

It is noted that detailed description of components in the present embodiment similar to those in each embodiment described above will not be repeated.

(Embodiment 4)

Figure 5:
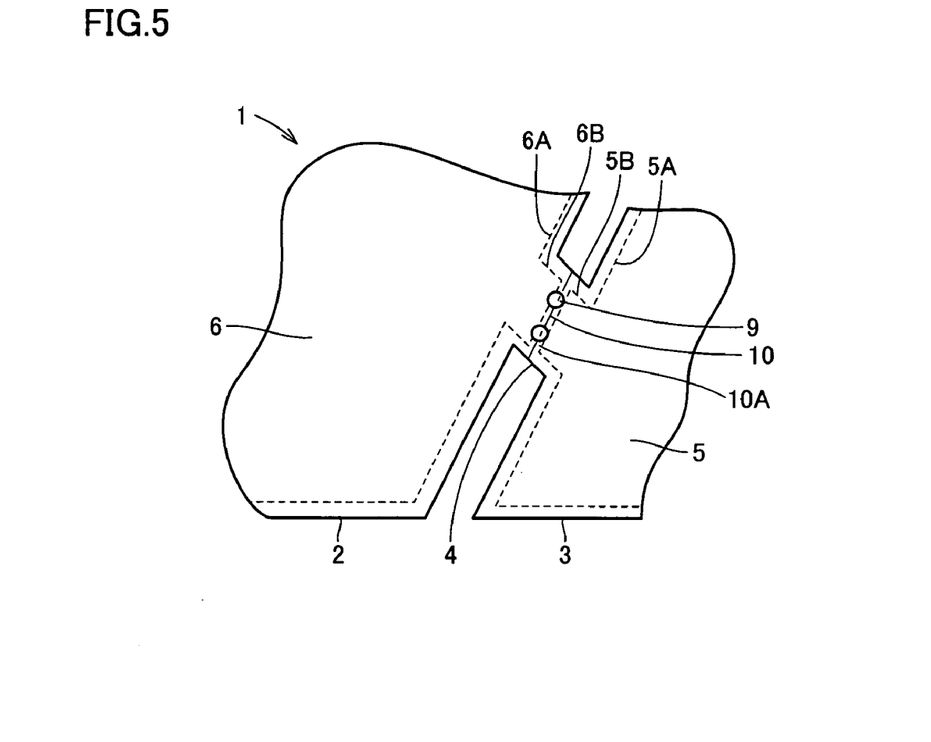
FIG. 5 is a detail view of portion A in FIG. 1, in the substrate according to Embodiment 4 of the present invention.

FIG. 5 is an enlarged, detailed view of an area around portion A (see FIG. 1) in substrate 1 according to Embodiment 4.

In substrate 1 according to the present embodiment, pattern outlines 5A, 6A include protruding portions 5B, 6B on bridge 4 (connection portion) respectively, as shown in FIG. 5. Thin portion 10A is thus formed between protruding portions 5B, 6B.

The structure as described above also attains an effect the same as that in each embodiment described above.

Here, an NC hole 9 (opening) guiding separation line 10, of which position is controlled by NC (numerical control), is provided in bridge 4 (connection portion) between patterns 5, 6.

In this manner, as separation line 10 is guided by NC hole 9, separation line 10 can be brought to an intended position with higher accuracy.

It is noted that detailed description of components in the present embodiment similar to those in each embodiment described above will not be repeated.

(Embodiment 5)

Figure 6:
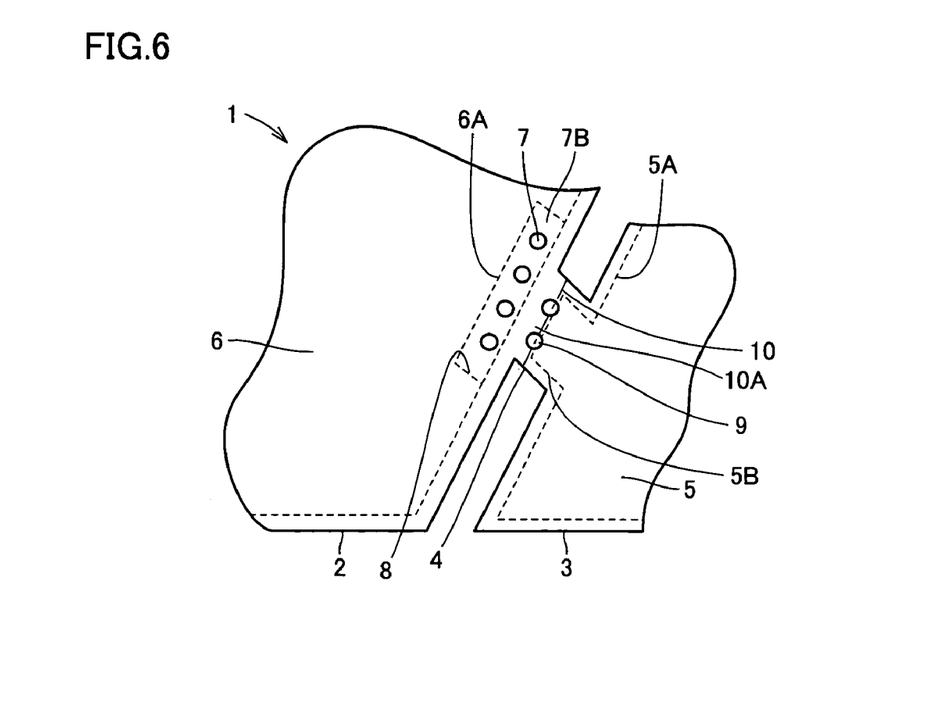
FIG. 6 is a detail view of portion A in FIG. 1, in the substrate according to Embodiment 5 of the present invention.

FIG. 6 is an enlarged, detail view of an area around portion A (see FIG. 1) in substrate 1 according to Embodiment 5.

In substrate 1 according to the present embodiment, through hole 7 is provided in main substrate 2 in the vicinity of bridge 4 (connection portion) and NC hole 9 (opening) guiding separation line 10 is provided in bridge 4 in the vicinity of an end of protruding portion 5B, as shown in FIG. 6.

In this manner, concave portion 8 is formed in pattern outline 6A and NC hole 9 can guide separation line 10. Therefore, a combined effect from Embodiments 2 and 4 described above can be obtained.

It is noted that detailed description of components in the present embodiment similar to those in each embodiment described above will not be repeated.

(Embodiment 6)

Figure 7:
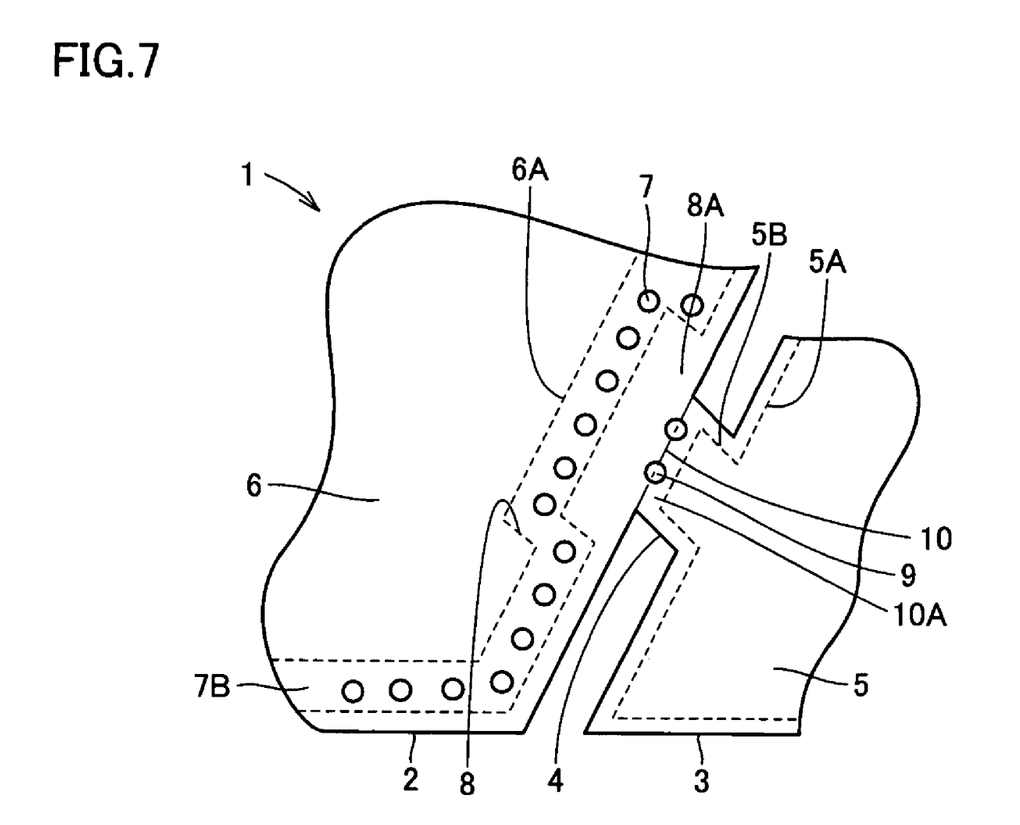
FIG. 7 is a detail view of portion A in FIG. 1, in the substrate according to Embodiment 6 of the present invention.

FIG. 7 is an enlarged, detail view of an area around portion A (see FIG. 1) in substrate 1 according to Embodiment 6.

In substrate 1 according to the present embodiment, through hole 7 is provided along pattern outline 6A and formed such that pattern outline 6A is located away from bridge 4 (connection portion) in the vicinity of the connection portion, and NC hole 9 (opening) guiding separation line 10 is provided in bridge 4 in the vicinity of the end of protruding portion 5B, as shown in FIG. 7.

In this manner, concave portion 8 larger than in Embodiment 5 can be formed in pattern outline 6A, and NC hole 9 can guide separation line 10. Therefore, a combined effect from Embodiments 3 and 4 described above can be obtained.

It is noted that detailed description of components in the present embodiment similar to those in each embodiment described above will not be repeated.

(Embodiment 7)

Figure 8A:
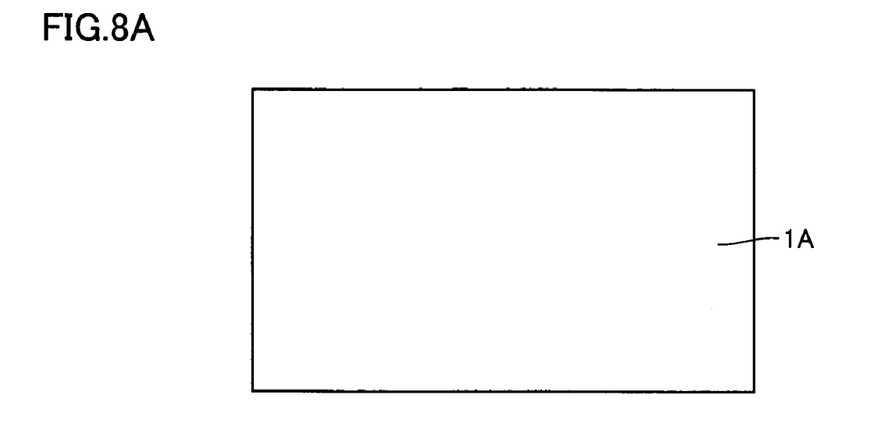
FIGS. 8A to 8C are top views showing first to third steps until a main substrate is fabricated in a method of manufacturing a multi-layer substrate according to Embodiment 7 of the present invention.
Figure 8B:
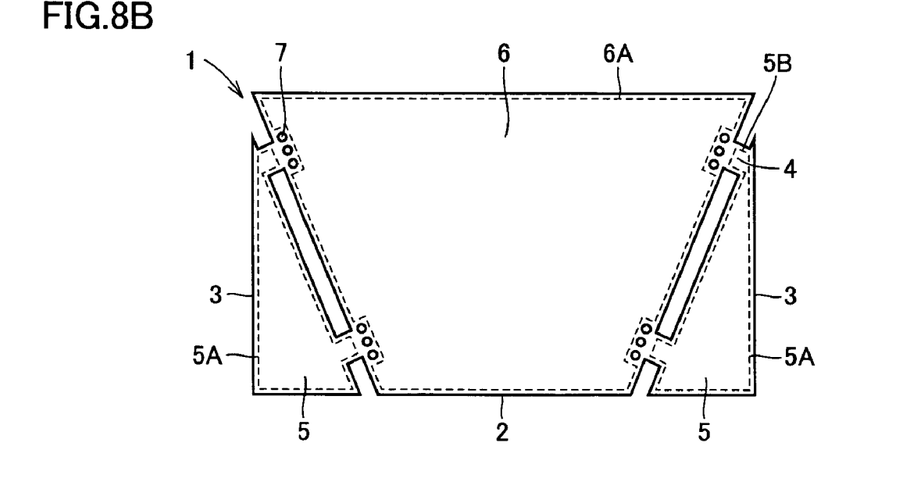
Figure 8C:
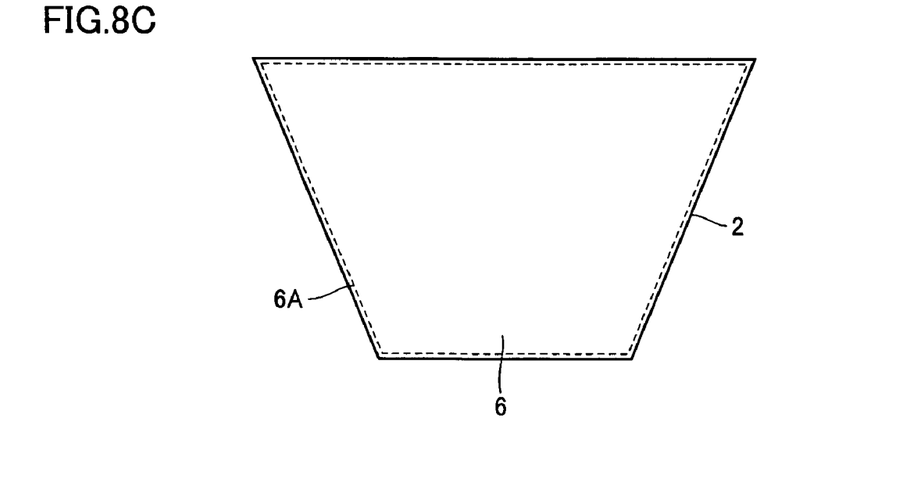
Figure 9:
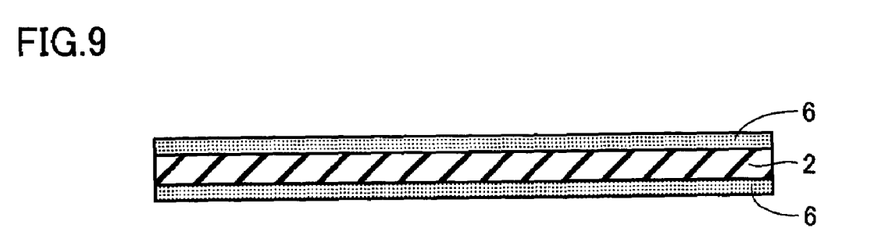
FIG. 9 is a cross-sectional view of the main substrate formed in an intermediate step of the method of manufacturing a multi-layer substrate according to Embodiment 7 of the present invention.
Figure 10:
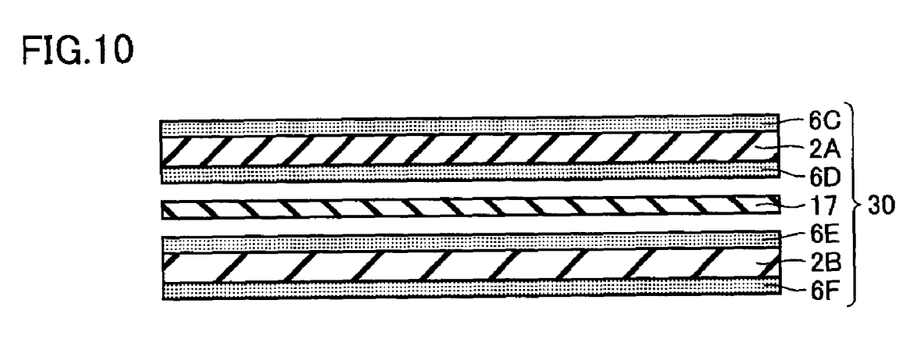
FIG. 10 is a cross-sectional view showing the step of laminating the main substrates in the method of manufacturing a multi-layer substrate according to Embodiment 7 of the present invention.
Figure 11:
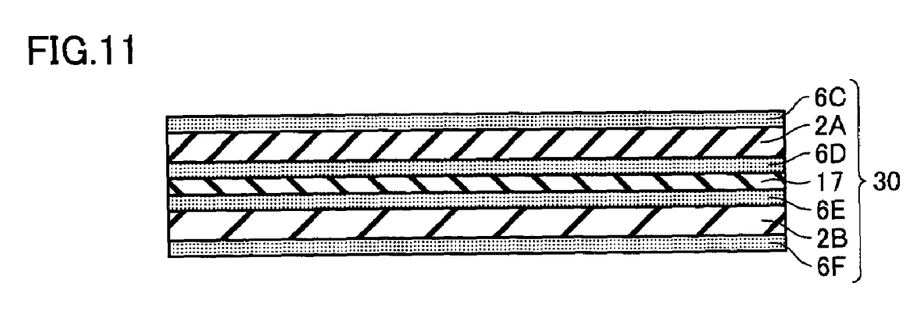
FIG. 11 is a cross-sectional view of the multi-layer substrate according to Embodiment 7 of the present invention.

FIGS. 8A to 11 illustrate each manufacturing step in a method of manufacturing a multi-layer substrate according to Embodiment 7. FIGS. 8A to 8C are top views illustrating the steps of fabricating main substrate 2 from a plate 1A, while FIGS. 9 to 11 are cross-sectional views illustrating the steps until fabricating a four-layer substrate 30 representing a multi-layer substrate by laminating main substrates 2.

In the present embodiment, the method of manufacturing a multi-layer substrate using the substrate according to Embodiments 1 to 6 described above will be discussed.

As shown in FIGS. 8 to 11, the method of manufacturing a multi-layer substrate according to the present embodiment includes the steps of: fabricating a plurality of substrates 1 in which main substrate 2 and sub substrate 3 are connected by bridge 4 (connection portion) from a state shown by plate 1A (FIG. 8A); forming a layer of pattern 6 (first pattern) on main substrate 2, forming a layer of dummy pattern 5 (second pattern) on sub substrate 3, and forming protruding portion 5B protruding on bridge 4 in dummy pattern 5 (FIG. 8B); separating main substrate 2 from sub substrate 3 at bridge 4 located in the vicinity of protruding portion 5B (FIG. 8C); and laminating main substrates 2 (FIGS. 9 to 11). Four-layer substrate 30 serving as a multi-layer substrate can be obtained through the steps described above.

In these steps, an effect the same as in each embodiment described above can be obtained, and the position of the separation line between main substrate 2 and sub substrate 3 can be stabilized. Therefore, four-layer substrate 30 in which pattern 6 formed on main substrate 2 attains high reliability can be obtained.

Here, the multi-layer substrate refers to a substrate including at least three pattern layers. It is noted that a multi-layer substrate including further larger number of pattern layers such as a six-layer substrate or an eight-layer substrate can be fabricated by repeating the laminating step described above.

In addition, as to the protruding portions on bridge 4 of pattern outlines 5A, 6A, an effect the same as described above can be attained if only the protruding portion is provided in at least one of patterns 5, 6.

In the following, each step described above will be discussed further in detail.

Plate 1A shown in FIG. 8A is formed with a dielectric such as fluoroplastic. As shown in FIG. 8B, substrate 1 including main substrate 2 and sub substrate 3 connected by bridge 4 is fabricated from plate 1A by press working, for example.

Then, a conductive film made of copper, for example, is formed on substrate 1 and subjected to patterning. Thus, pattern 6 is formed on main substrate 2, while dummy pattern 5 is formed on sub substrate 3.

The step of forming the conductive film described above is performed by electrolytic plating, electroless plating, vacuum deposition, sputtering, or the like. In addition, patterning of the conductive film may be performed using plating resist or a resist formed by irradiating a photosensitive resin film on the conductive film with a laser beam.

Thereafter, main substrate 2 is separated from sub substrate 3, and main substrate 2 having pattern 6 formed on the main surface as shown in FIG. 8C is taken out.

FIG. 9 is a cross-sectional view of main substrate 2 having pattern 6 formed on opposing surfaces. Note that pattern 6 does not necessarily have to be formed on both surfaces of main substrate 2, and may be formed on any one surface.

FIG. 10 illustrates the step of laminating a plurality of main substrates 2 (2A, 2B). Here, patterns 6 (patterns 6A, 6B and patterns 6C, 6D) are formed on both surfaces of main substrates 2A, 2B respectively, and substrates 2A, 2B are adhered to each other by means of an adhesive layer that serves as an insulating layer 16 after it is hardened. Four-layer substrate 30 shown in FIG. 11 is thus fabricated.

(Embodiment 8)

Figure 12:
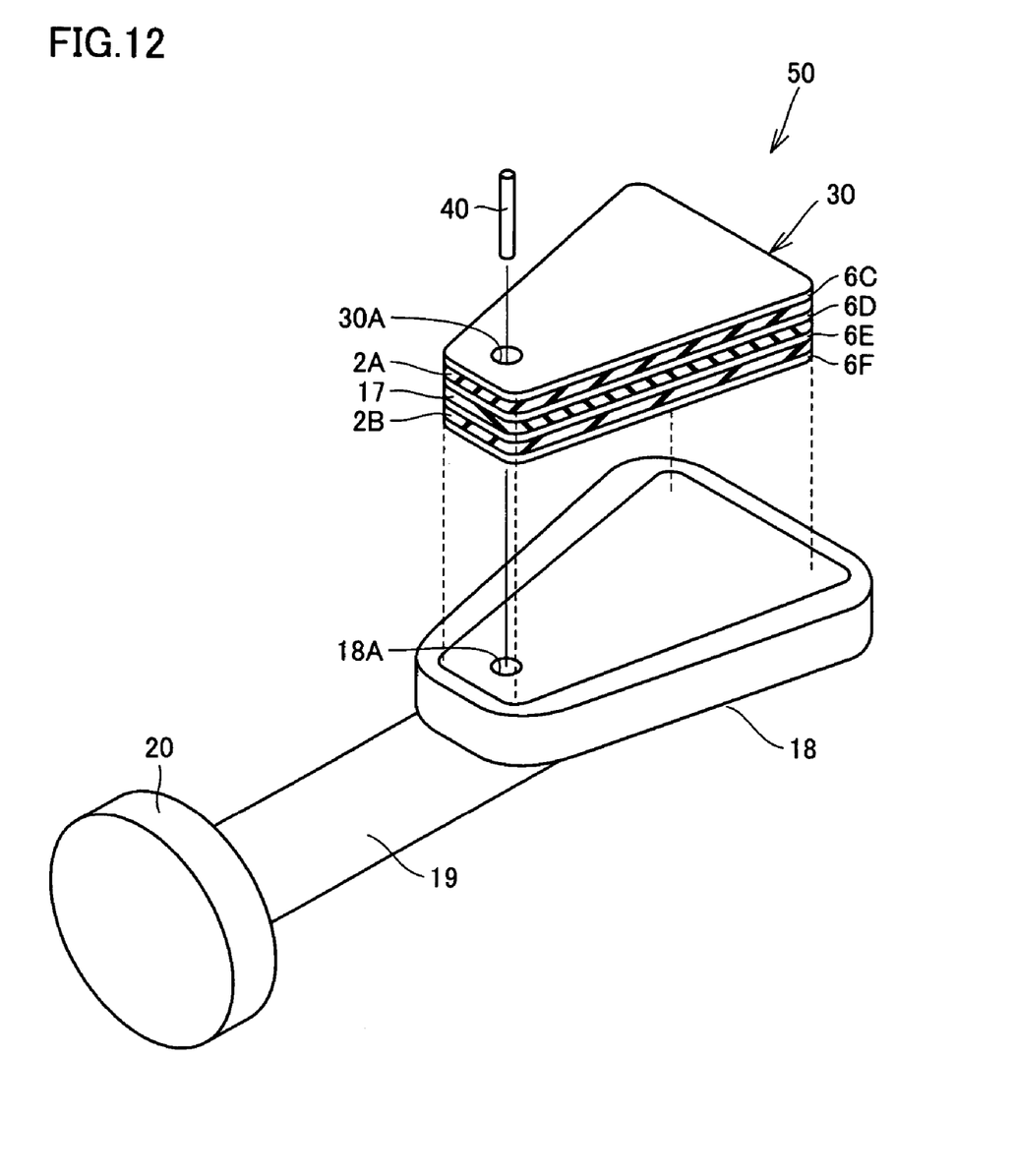
FIG. 12 is a perspective view of an LNB according to Embodiment 8 of the present invention.

FIG. 12 is a perspective view of an LNB 50 serving as a satellite broadcasting reception apparatus according to Embodiment 8.

LNB 50 according to the present embodiment includes four-layer substrate 30 (multi-layer substrate) manufactured according to the manufacturing method described in Embodiment 7.

In the following, a structure of LNB 50 will be described in further detail.

In FIG. 12, LNB 50 receives a weak signal transmitted from a satellite at a radio wave reception unit 20. The signal propagates through a waveguide 19 and is received by a probe 40 soldered substantially perpendicularly to four-layer substrate 30. Thereafter, the signal is transmitted to a low noise amplifier. Probe 40 passes through a probe attachment hole 30A provided in four-layer substrate 30 and is inserted into a probe insertion hole 18A provided in a chassis 18. Four-layer substrate 30 is thus fixed in chassis 18.

Four-layer substrate 30 includes four pattern layers 6 (6C, 6D, 6E, 6F) made of a conductor and dielectric layers 2A, 2B, 17 between the respective pattern layers. Each pattern layer attains a function as a layer necessary for a converter, such as a microstrip line or a ground layer.

Though four-layer substrate 30 and chassis 18 are shaped like a trapezoid in FIG. 12, the shape is not limited thereto, but another shape (such as a shape closer to a rectangle, as compared with the example shown in FIG. 12) may be employed.

As described above, in four-layer substrate 30 in LNB 50, pattern 6 attaining high reliability (6C, 6D, 6E, 6F), that is, unlikely to come off at an outer periphery of the main surface of the substrate, is formed. As a result, the LNB attaining high reliability can be obtained.

Though embodiments of the present invention have been described as above, it is noted that combination of the features in each embodiment described above is within the scope of the present invention.

According to the present invention, the position of the separation line between the main substrate and the sub substrate can be stabilized in the substrate having the pattern layer on the main surface. Consequently, manufacture of the multi-layer substrate having the pattern layer attaining high reliability and the satellite broadcasting reception apparatus (LNB) can be facilitated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate, comprising:
    a main substrate having a first pattern layer on a main surface;
    a sub substrate having a second pattern layer on a main surface;
    a connection portion connecting said main substrate and said sub substrate; and
    a thin portion in said connection portion between said first and second pattern layers, wherein
    the connection portion is formed from the substrate from which the main substrate and sub substrate are formed.

2. The substrate according to claim 1, wherein
    said main substrate is provided with a through hole in a vicinity of said connection portion.

3. A substrate, comprising:
    a main substrate having a first pattern layer on a main surface;

a sub substrate having a second pattern layer on a main surface;

a connection portion connecting said main substrate and said sub substrate; and a thin portion provided on said connection portion between said first and second patterns, wherein a concave portion is provided in an outline of said first pattern area in the vicinity of said connection portion.

4. The substrate according to claim 1, wherein an opening is provided in said connection portion between said first and second patterns.

5. A substrate, comprising:

a main substrate having a first pattern layer on a main surface;

a sub substrate having a second pattern layer on a main surface; and a connection portion between said main substrate and said sub substrate; wherein at least one of said first and second pattern layers has a protruding portion protruding on said connection portion, wherein the connection portion is formed from the substrate from which the main substrate and the sub substrate are formed.

6. A method of manufacturing a multi-layer substrate, comprising the steps of:

fabricating a plurality of substrates in which a main substrate and a sub substrate are connected by a connection portion;

forming a first pattern layer on said main substrate, forming a second pattern layer on said sub substrate, and forming a protruding portion protruding on said connection portion on at least one of said first and second pattern layers;

separating said main substrate from said sub substrate at said connection portion located in a vicinity of said protruding portion; and laminating said main substrates.

7. A satellite broadcasting reception apparatus comprising a multi-layer substrate manufactured with the method according to claim 6.

* * * * *